US012696611B2

(12) United States Patent (10) Patent No.: US 12,696,611 B2

Meng et al. (45) Date of Patent: Jul. 28, 2026

(54) DETECTION SUBSTRATE AND FLAT-PANEL DETECTOR

(71) Applicant: BOE Technology Group Co., Ltd., Beijing (CN)

(72) Inventors: Fanli Meng, Beijing (CN); Jiangbo Chen, Beijing (CN); Zeyuan Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1352 days.

(21) Appl. No.: 17/476,343

(22) Filed: Sep. 15, 2021

(65) Prior Publication Data

US 2022/0231086 A1 Jul. 21, 2022

(30) Foreign Application Priority Data

Jan. 15, 2021 (CN) .......................... 202110058059.6

(51) Int. Cl.
| | |
|---|---|
| *H10K 39/36* | (2026.01) |
| *G01T 1/20* | (2006.01) |
| *H10F 39/00* | (2025.01) |
| *H10F 39/18* | (2025.01) |
| *H10K 39/32* | (2026.01) |
| *H10K 85/50* | (2023.01) |

(52) U.S. Cl.
CPC ........... *H10K 39/36* (2023.02); *G01T 1/2018* (2013.01)

(58) Field of Classification Search
CPC .... H10K 39/36; G01T 1/2018; H10F 39/8033
See application file for complete search history.

(56) References Cited

U.S. PATENT DOCUMENTS

| | | | |
|---|---|---|---|
| 2004/0146138 A1 | 7/2004 | Jiao | |
| 2010/0054418 A1* | 3/2010 | Okada ................. | G01T 1/20187 |
| | | | 378/114 |
| 2023/0165541 A1* | 6/2023 | Xu ......................... | A61B 6/032 |
| | | | 250/309 |

FOREIGN PATENT DOCUMENTS

| | | |
|---|---|---|
| CN | 101919023 A | 12/2010 |
| CN | 109427837 A | 3/2019 |

(Continued)

OTHER PUBLICATIONS

CN202110058059.6 first office action dated Dec. 28, 2024.

*Primary Examiner* — Antonio B Crite
(74) *Attorney, Agent, or Firm* — IPro, PLLC

(57) ABSTRACT

A detection substrate and a flat-panel detector, and relates to the technical field of photoelectric detection. The detection substrate can improve radiation resistance and prolong a service life without increasing the thickness of a scintillator layer. The detection substrate includes a plurality of detection pixel units arranged in an array. Each of the detection pixel units includes: a transistor, a photoelectric conversion section, and a scintillator layer, with the photoelectric conversion section disposed between the transistor and the scintillator layer, the photoelectric conversion section includes a radiation sensitive layer and a photosensitive unit, which are laminated in arrangement; the radiation sensitive layer is configured to absorb rays and convert the rays into carriers; and the photosensitive unit is configured to at least absorb visible light and convert the visible light into carriers. The present disclosure is applicable to the production of the detection substrates.

17 Claims, 6 Drawing Sheets

(56)          References Cited

FOREIGN PATENT DOCUMENTS

| | | | | | |
|---|---|---|---|---|---|
| CN | 109863599 | A | | 6/2019 | |
| CN | 111653581 | A | | 9/2020 | |
| CN | 111948696 | A | | 11/2020 | |
| CN | 112117290 | A | * | 12/2020 | ......... H10F 39/8067 |
| KR | 20170029371 | A | | 3/2017 | |
| KR | 20180044679 | A | * | 5/2018 | ........... H01L 31/085 |

\* cited by examiner

DETECTION SUBSTRATE AND FLAT-PANEL DETECTOR

CROSS REFERENCE TO RELEVANT DISCLOSURES

The present application claims the priority of the Chinese patent application filed on Jan. 15, 2021 before the Chinese Patent Office with the application number of 202110058059.6 and the title of "DETECTION SUBSTRATE AND FLAT-PANEL DETECTOR", which is incorporated herein in its entirety by reference.

TECHNICAL FIELD

The present disclosure relates to the technical field of photoelectric detection, and in particular, relates to a detection substrate and a flat-panel detector.

BACKGROUND

With the continuous development of X-ray digital imaging technologies, X-ray images can be directly converted into digital images by flat panel X-ray detector (FPXD), which have a broad application prospect in fields such as medical treatment, security, and industrial detection.

SUMMARY

Embodiments of the present disclosure provide a detection substrate and a flat-panel detector. The embodiments of the present disclosure employ the following technical solutions.

In one aspect, there is provided a detection substrate, which includes a plurality of detection pixel units arranged in an array, wherein each of the detection pixel units includes: a transistor, a photoelectric conversion section, and a scintillator layer, with the photoelectric conversion section disposed between the transistor and the scintillator layer, wherein the photoelectric conversion section includes a radiation sensitive layer and a photosensitive unit, which are laminated in arrangement; the radiation sensitive layer is configured to absorb rays and convert the rays into carriers; and the photosensitive unit is configured to at least absorb visible light and convert the visible light into carriers.

Optionally, the photosensitive units are disposed at a side of the radiation sensitive layers away from the transistors.

Optionally, the radiation sensitive layers of the respective detection pixel units are of an integral structure and the photosensitive units of the respective detection pixel units are of an integral structure.

Optionally, the detection substrate further comprises a substrate, on which the detection pixel units are disposed; and in each of the detection pixel units, an orthographic projection of the transistor on the substrate is within an orthographic projection of the radiation sensitive layer on the substrate.

Optionally, the detection substrate further comprises a substrate, on which the detection pixel units are disposed; and in each of the detection pixel units, an orthographic projection of the photosensitive unit on the substrate is within an orthographic projection of the radiation sensitive layer on the substrate.

Optionally, a material for the radiation sensitive layers comprises a heavy element with a band gap greater than 2.0 eV.

Optionally, the photosensitive units comprise photoconductive devices or photoelectric diodes.

Optionally, the photoelectric conversion sections further comprise connection electrodes, which are disposed between the radiation sensitive layers and the photosensitive units.

Optionally, the photosensitive units are configured to absorb rays and convert the rays into carriers.

Optionally, the photosensitive units comprise perovskite layers.

Optionally, a material for perovskite layers includes: a perovskite material having an $A_aB_bX_x$ molecular structure, wherein $A_a$ includes any one or more of: an organic amine group, formamidine, a cesium ion, a rubidium ion, a silver ion, a cuprous ion; $B_b$ includes: a lead ion or a bismuth ion; and $X_x$ includes any one or more of: iodine, chlorine, and bromine.

Optionally, the detection pixel units further comprise reading electrodes and bias electrodes; the reading electrodes are disposed at a side of the photoelectric conversion sections close to the transistors; and the bias electrodes are disposed at a side of the photoelectric conversion sections away from the transistors.

Optionally, the reading electrodes of the respective detection pixel units are mutually independent, and the bias electrodes of the respective detection pixel units are of an integral structure.

Optionally, the transistors comprise thin-film transistors or complementary metal oxide semiconductor transistors.

In another aspect, there is provided a flat-panel detector, which includes the detection substrate defined above.

BRIEF DESCRIPTION OF THE DRAWINGS

To describe the technical solutions in the embodiments of the present disclosure or in the prior art more clearly, the following briefly introduces the accompanying drawings to be used in the descriptions of the embodiments or the prior art. Obviously, the accompanying drawings in the following description show merely some embodiments of the present disclosure, and a person of ordinary skills in the art may still derive other drawings from these accompanying drawings without creative efforts.

DETAILED DESCRIPTION

The technical solutions in the embodiments of the present disclosure will be described clearly and completely below in conjunction with the accompanying drawings in the embodiments of the present disclosure. Obviously, the embodiments described are merely some rather than all of the embodiments of the present disclosure. Based on the embodiments of the present disclosure, every other embodiment obtained by a person of ordinary skills in the art without making inventive efforts shall fall within the protection scope of the present disclosure.

In the embodiments of the present disclosure, unless otherwise clearly specified, "a plurality of" means two or more.

In the embodiments of the present disclosure, terms such as "up" and "down" indicate directions or positional relations based on the directions or position relations shown in the accompanying drawings only for the purposes of describing the present disclosure and simplifying the description, instead of indicating or implying that a referred device or element must have a specific direction or must be constructed and operated in a specific direction. Therefore, these terms should not be construed as limiting the present disclosure.

An embodiment of the present disclosure provides a detection substrate. Referring to the depiction in FIG. 1, the detection substrate includes a plurality of detection pixel units 100 arranged in an array.

Figure 3:
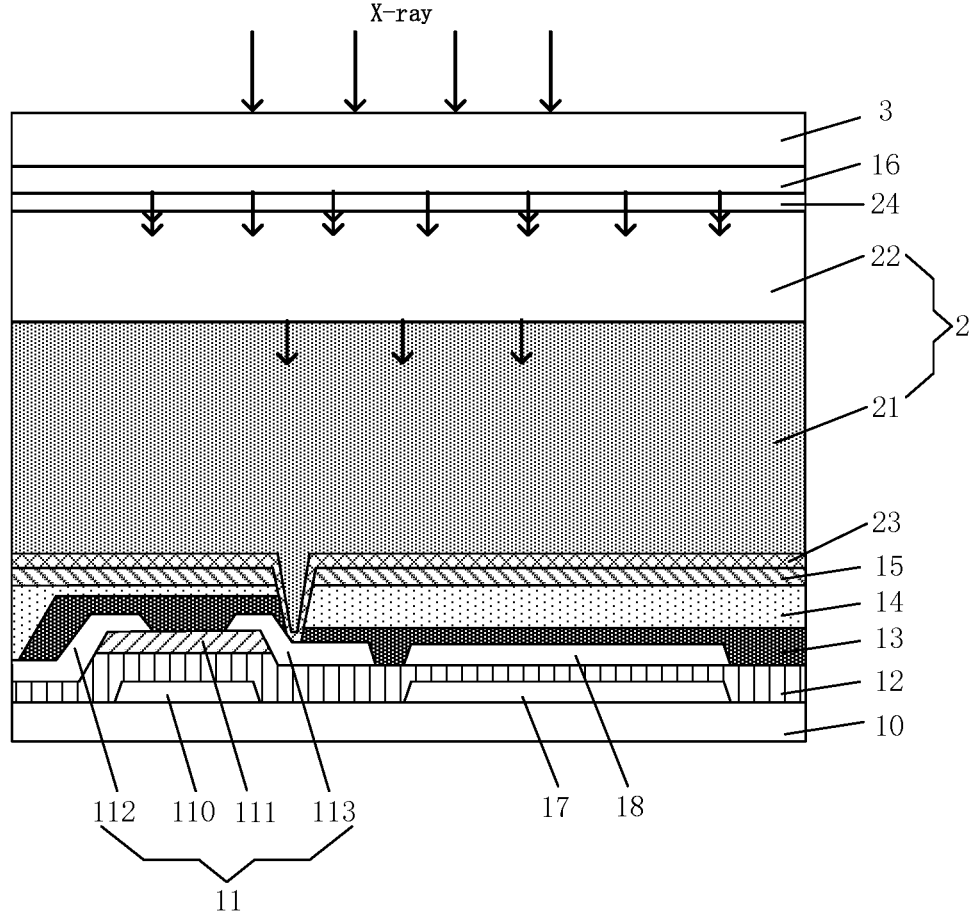
FIG. 3 is a schematic sectional diagram taken along a direction CC' in FIG. 2.

Referring to the depiction in FIG. 3, each of the detection pixel units includes: a transistor (which is depicted as a thin-film transistor 11 in FIG. 3), a photoelectric conversion section 2, and a scintillator layer 3, with the photoelectric conversion section 2 located between the transistor and the scintillator layer 3.

Here, referring to the depiction in FIG. 3, the photoelectric conversion section 2 includes a radiation sensitive layer 21 and a photosensitive unit 22, which are laminated in arrangement, where the radiation sensitive layer is configured to absorb rays and convert the rays into carriers; and the photosensitive unit is configured to at least absorb visible light and convert the visible light into carriers.

In the photoelectric conversion section described above, relative positions of the radiation sensitive layer and the photosensitive unit are not limited. As an example, the photosensitive unit may be disposed at a side of the radiation sensitive layer away from the transistor; or the photosensitive unit may be disposed at a side of the radiation sensitive layer close to the transistor. The accompanying drawings of the embodiments of the present disclosure are depicted based on the former, by way of example. The structures of the radiation sensitive layer and the photosensitive unit are not specifically limited here, as long as corresponding requirements are met.

In the plurality of detection pixel units described above, the radiation sensitive layers of the respective photoelectric conversion sections may be of an integral structure or mutually independent; and the photosensitive units of the respective photoelectric conversion sections may be of an integral structure or mutually independent. These are not limited here.

Figure 4:
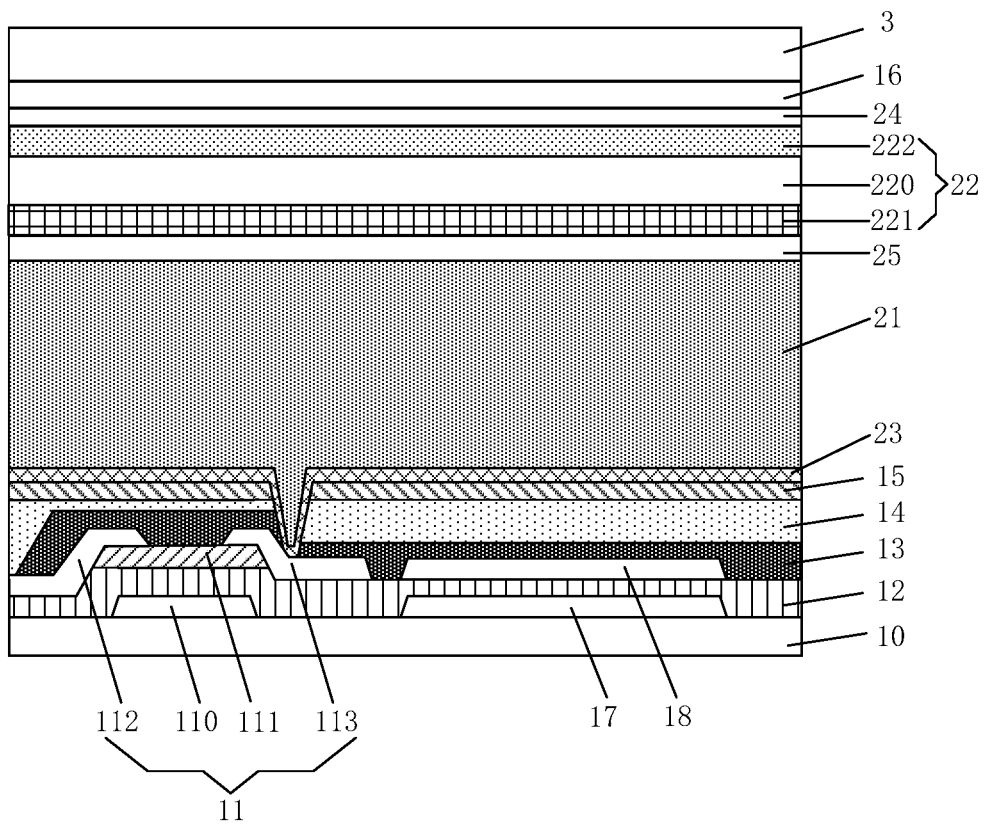
FIG. 4 is another schematic sectional diagram taken along the direction CC' in FIG. 2.
Figure 5:
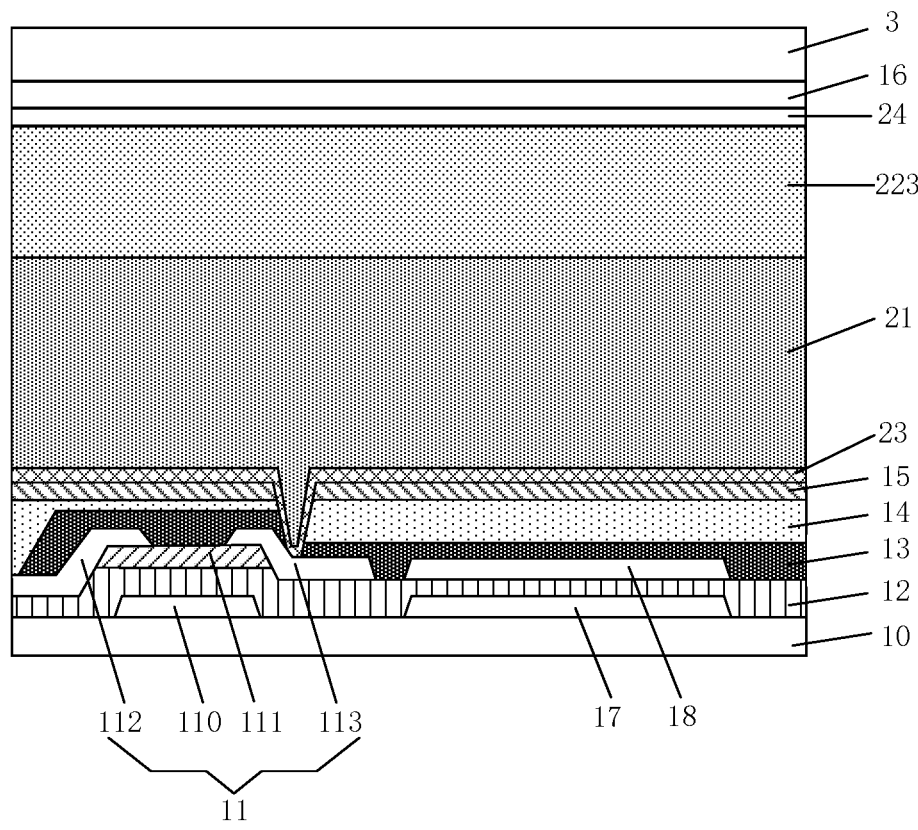
FIG. 5 is still another schematic sectional diagram taken along the direction CC' in FIG. 2.
Figure 6:
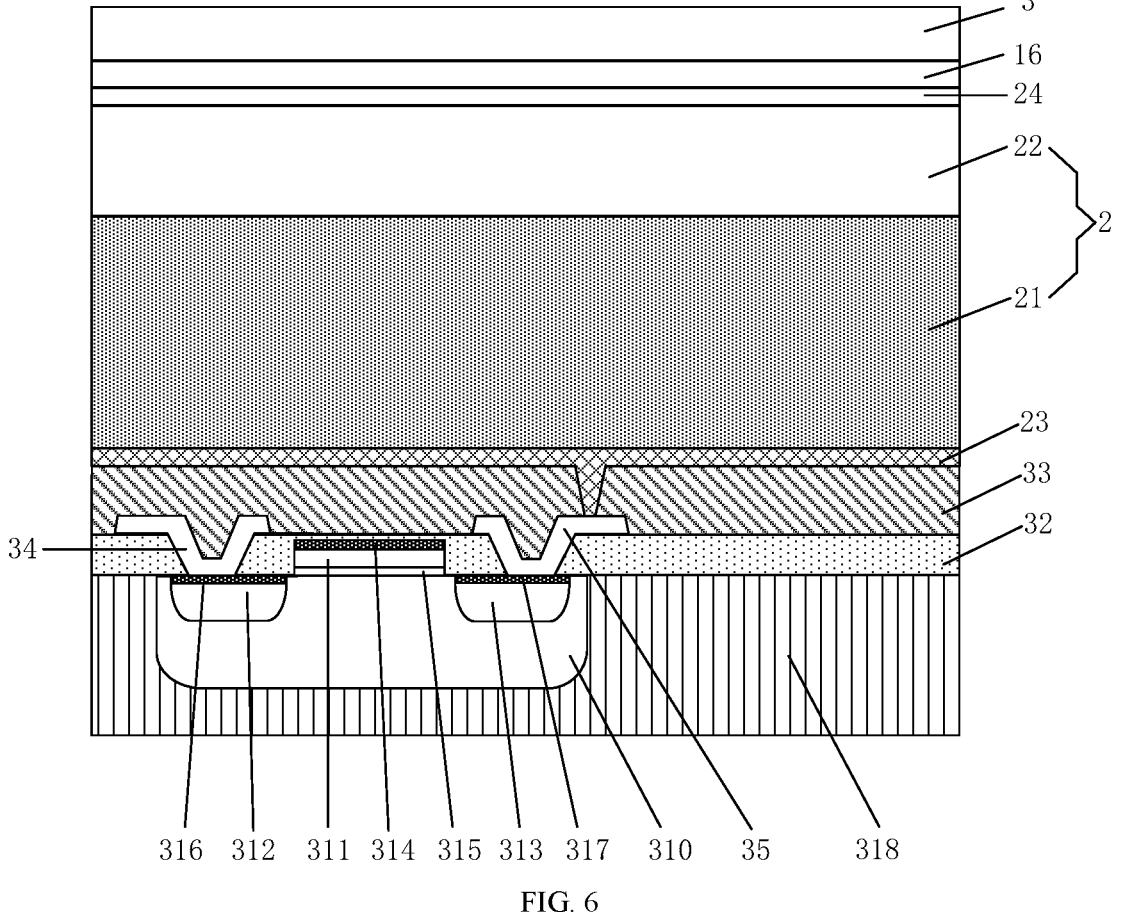
FIG. 6 is a schematic structural diagram of another detection pixel unit according to an embodiment of the present disclosure.

The type of the above-mentioned transistor is not limited. It may be a thin-film transistor 11 as shown in FIGS. 3 to 5, or may be a complementary metal oxide semiconductor transistor (CMOS transistor) as shown in FIG. 6, or may also be other types of field effect tubes.

A material for the above-mentioned scintillator layer is not limited. As an example, the material of the scintillator layer may include any one of cesium iodide (CsI), gadolinium oxide sulfide (GOS), tungstate, alkali metal halide, lutetium fine silicate (LFS), lutetium yttrium silicate (LYSO), thallium-doped sodium iodide (NaI:Tl), cesium iodide (CsI), bismuth germanate ($Bi_4Ge_3O_{12}$, BGO), gadolinium aluminum gallium garnet (GAGG) and the like, where the tungstate may include cadmium tungstate ($CdWO_4$) or lead tungstate (PWO) and the like. The scintillator layer formed from these materials may convert the X-rays into the visible light.

Referring to the depiction in FIG. 3, when the X-rays (indicated by a single-arrow line in FIG. 3) irradiate the scintillator layer 3, some of the X-rays are absorbed by the scintillator layer 3 and converted into the visible light (indicated by a double-arrow line in FIG. 3), and the rest of the X-rays transmits through the scintillator layer 3 and irradiates towards the photoelectric conversion section 2. The photosensitive unit 22 absorbs the visible light and converts it into carriers, and the X-rays transmitted through the scintillator layer 3 are absorbed by the radiation sensitive layer 21 and converted into the carriers, thereby preventing the rays that are not absorbed by the scintillator layer from radiating the transistor. As a result, the radiation resistance is improved and the service life is prolonged without increasing the thickness of the scintillator layer. It should be noted that FIG. 3 depicts the photosensitive unit that is disposed at a side of the radiation sensitive layer away from the transistor, by way of example. If the photosensitive unit is disposed at a side of the radiation sensitive layer close to the transistor, the radiation sensitive layer then is closer to the scintillator layer with respect to the photosensitive unit. Then, after the X-rays irradiate the scintillator layer, the X-rays transmitted through the scintillator layer are absorbed by the radiation sensitive layer and converted into the carriers, and the visible light transmits through the radiation sensitive layer to irradiate towards the photosensitive unit, which absorbs the visible light and convert it into the carriers. In such a structure, the rays that are not absorbed by the scintillator layer may be further prevented from radiating the photosensitive unit, thereby alleviating a radiation damage to the photosensitive unit.

An embodiment of the present disclosure provides a detection substrate. When rays irradiate the detection substrate, the scintillator layers convert the rays into the visible light, which is absorbed by the photosensitive units and converted into carriers. Meanwhile, the rays transmitted through the scintillator layers may be absorbed by the radiation sensitive layers and converted into carriers, thereby preventing the rays that are not absorbed by the scintillator layers from radiating the transistors. As a result, in one aspect, the radiation resistance is improved and the service life is prolonged without increasing the thickness of the scintillator layers, i.e., without reducing a spatial modulation transfer function; and in another aspect, the radiation sensitive layers can absorb the rays transmitted through the scintillator layers and convert them into carriers, which can increase a light current and reduce a dark current of the photosensitive units, thereby increasing a signal-to-noise ratio.

Optionally, in consideration of maximally converting the visible light into electric signals to further increase a photoelectric conversion efficiency, the photosensitive units are disposed at a side of the radiation sensitive layers away from the transistors. Then, the photosensitive units are closer to the scintillator layers with respect to the radiation sensitive layers, and the visible light converted by the scintillator layers may enter the photosensitive units via a short path, and then are absorbed by the photosensitive units and converted into the carriers.

Optionally, in order to reduce the times of patterning and lower the impacts of a patterning process on the transistors, the radiation sensitive layers of the respective detection pixel units are of an integral structure, and the photosensitive units of the respective detection pixel units are of an integral structure. That is, the radiation sensitive layers of the respective detection pixel units are mutually connected, and the photosensitive units of the respective detection pixel units are mutually connected.

Without doubt, the radiation sensitive layers of the respective detection pixel units may also be mutually independently arranged, and the photosensitive units of the respective detection pixel units may also be mutually independently arranged, thereby reducing a mutual impact among the detection pixel units.

Optionally, referring to the depiction in FIG. 3, the detection substrate further includes a substrate 10, on which the detection pixel units 2 are disposed.

In each of the detection pixel units, an orthographic projection of the transistor on the substrate is within an orthographic projection of the radiation sensitive layer on the substrate. In this way, the radiation sensitive layers may better protect the transistors to further reduce a damage to the transistors caused by the rays, thereby further increasing the performance and service life of the transistors.

The aforesaid orthographic projection of the transistor on the substrate refers to a projection of the transistor on the substrate along a direction vertical to the substrate; and the aforesaid orthographic projection of the radiation sensitive layer on the substrate refers to a projection of the radiation sensitive layer on the substrate along the direction vertical to the substrate.

Optionally, referring to the depiction in FIG. 3, the detection substrate further includes a substrate 10, on which the detection pixel units 2 are disposed.

In each of the detection pixel units, an orthographic projection of the photosensitive unit on the substrate is within an orthographic projection of the radiation sensitive layer on the substrate. In this way, the radiation sensitive layers may better protect the photosensitive units to further reduce the damage to the transistors caused by the rays, thereby further increasing the performance and service life of the transistors.

The aforesaid orthographic projection of the photosensitive unit on the substrate refers to a projection of the photosensitive unit on the substrate along the direction vertical to the substrate.

Without doubt, in order to maximally converting the visible light into the carriers to increase the photoelectric conversion efficiency, the aforesaid orthographic projections of the photosensitive units on the substrate may also be overlapped with the orthographic projections of the radiation sensitive layers on the substrate, which is depicted as an example in FIG. 3 of the embodiment of the present disclosure.

Optionally, a material for the above-mentioned radiation sensitive layers includes a heavy element with a band gap greater than 2.0 eV.

The heavy element refers to an element with a high atomic number and a great relative atomic mass, for example, lead and bismuth. The band gap, also called an energy gap, refers to an energy difference between a lowest point of a conduction band and a highest point of a valence band. The greater the band gap, the harder electrons are excited to the conduction band by the valence band, the lower the concentration of intrinsic carriers, and the lower the conductivity. The aforesaid radiation sensitive layers have a band gap of greater than 2.0 eV, which pertains to a wide band gap and may absorb rays and convert them into carriers and meanwhile may allow some of the visible light to transmit through. As an example, specifically, the band gap may be 2.1 eV, 2.2 eV, 2.3 eV and the like, and further, the band gap may also be greater than 2.3 eV. This will not be specifically limited here and can be determined according to actual needs.

Further optionally, a material for the radiation sensitive layers includes any one of lead iodide, lead oxide, and bismuth iodide. The lead iodide or lead oxide is preferred.

Optionally, each of the photosensitive units includes a photoconductive device or a photoelectric diode.

As an example, the photoconductive device may include a metal-semiconductor-metal (MSM) type photoconductive device. The MSM type photoconductive device includes a first metal layer, a semiconductor layer and a second metal layer which are laminated in arrangement, where the first metal layer is closer to the transistor compared with the second metal layer. The MSM type photoconductive device in such a structure belongs to a vertical photoconductive device. Here, the semiconductor layer may include any one of an intrinsic aSi:H monolayer (an intrinsic hydrogenated amorphous silicon layer), an aSi:H PIN composite layer (an intrinsic hydrogenated amorphous silicon composite layer), and a perovskite monolayer.

The photoelectric diode may include a PIN photoelectric diode or an organic diode. As an example, referring to the depiction in FIG. 4, the photosensitive unit 22 may include a first doped layer 221, an intrinsic layer 220, and a second doped layer 222 that are laminated in arrangement, where the first doped layer 221 is closer to the transistor compared with the second doped layer 222. Here, the first doped layer may be a P-type doped layer, and the second doped layer may be an N-type doped layer. Then, the photoelectric diode may be called an NIP photoelectric diode. Or, the first doped layer may be an N-type doped layer, and the second doped layer may be a P-type doped layer. Then, the photoelectric diode may be called a PIN photoelectric diode. The intrinsic layer 220 may include an organic or inorganic perovskite layer.

To strictly define the respective operating voltages of the radiation sensitive layers and the photosensitive units and simultaneously allow a base to be flatter to facilitate the production of the photosensitive units, referring to the depiction in FIG. 4, each of the photoelectric conversion sections may further include a connection electrode 25, which is disposed between the radiation sensitive layer 21 and the photosensitive unit 22. A material of the connection electrode may include a conductive material such as metal.

It should be noted that the connection electrodes of the respective detection pixel units may be of an integral structure or mutually independent. The former may be selected for the purpose of reducing the times of patterning and lowering the impact of a patterning process on the transistors; and the latter may be selected for the purpose of reducing the mutual impact among the detection pixel units. This is not limited here.

Optionally, the photosensitive units are configured to absorb rays and convert the rays into carriers.

Further optionally, referring to the depiction in FIG. 5, the photosensitive unit includes a perovskite layer 223, where a perovskite heterojunction may be formed between the perovskite layer 223 and the radiation sensitive layer 21, and carriers produced in the perovskite layer may be effectively injected into the radiation sensitive layer. The perovskite layer may absorb the visible light and convert it into carriers in one aspect, and in another aspect, may absorb some of the rays transmitted through the scintillator layers and convert them into carriers.

Optionally, a material for the perovskite layer includes: a perovskite material having an $A_aB_bX_x$ molecular structure, wherein $A_a$ includes any one or more of: an organic amine group, formamidine, a cesium ion, a rubidium ion, a silver ion, a cuprous ion; $B_b$ includes: a lead ion or a bismuth ion; and $X_x$ includes any one or more of: iodine, chlorine, and bromine. As an example, the material for the perovskite layer may include a perovskite material of an $ABX_3$ (for example, $MAPbI_3$) molecular structure; or may further include a perovskite material of a molecular structure such as $A_3B_2X_9$ (for example, $Cs_3Bi_2I_9$), $AB_2X_7$ (for example, $AgBi_2I_7$), $ABX_4$ (for example, $AgBiI_4$), $A_2BX_5$ (for example, $Ag_2BiI_5$), and $A_3BX_6$ (for example, $Ag_3BiI_6$).

As an example, the material for the perovskite layer includes methylamine iodine lead ($MAPbI_3$). Then, if the radiation sensitive layers include the lead iodide, a $PbI_2$-$MAPbI_3$ perovskite heterojunction may be formed, and the carriers produced in the $MAPbI_3$ perovskite layers may be effectively injected into the $PbI_2$ radiation sensitive layers.

Optionally, referring to the depiction in FIG. 3, each of the detection pixel units further includes a reading electrode 23 and a bias electrode 24, where the reading electrode 23 is disposed at a side of the photoelectric conversion section 2 close to the transistor, and the bias electrode 24 is disposed at a side of the photoelectric conversion section 2 away from the transistor.

A material for the reading electrodes may include metal, metal alloy and other conductive materials. As an example, each of the reading electrodes may include a metal layer, and a material of the metal layer includes molybdenum (Mo), with a thickness that may be 2000 Å. Or, each of the reading electrodes may further include two laminated layers, where the layer close to the transistor may include molybdenum, with a thickness of 100-400 nm; and the layer away from the transistor may include indium tin oxide (ITO), with a thickness of 70 nm.

A material for the bias electrodes may include transparent conductive materials such as ITO, fluorine-doped tin oxide (FTO) transparent conductive glass, aluminum-doped zinc oxide (AZO) transparent conductive glass, and 3,4-polyethylenedioxythiophene:polystyrene sulfonate (PEDOT:PSS).

If the connection electrodes are not disposed between the photosensitive units and the radiation sensitive layers, referring to the depiction in FIG. 3, a certain bias voltage may be applied to the bias electrode 24 when the detection substrate is in a working state, where a value of the bias voltage may be a sum of operating voltages of the photosensitive units 22 and the radiation sensitive layers 21. As an example, if the aSi:H PIN diodes are used as the photosensitive units and the $PbI_2$ layers with the thickness of 50 um are used as the radiation sensitive layers, an operating reversed bias voltage of aSi:H PIN is 7 V based on that an operating electric field of $PbI_2$ is 0.5 V, and then, a sum of the operating voltages of the two is 0.5V/um*50 um+7V=32V. That is, with respect to the same potential, a voltage of –32 V may be applied to the bias electrodes, and a voltage of 0 V may be applied to the reading electrodes.

If the connection electrodes are disposed between the photosensitive units and the radiation sensitive layers, referring to the depiction in FIG. 4, a certain bias voltage may be respectively applied to the bias electrodes 24 and the connection electrodes 25 when the detection substrate is in a working state. As an example, if the aSi:H PIN diodes are used as the photosensitive units and the $PbI_2$ layers with the thickness of 50 um are used as the radiation sensitive layers, an operating reversed bias voltage of aSi:H PIN is 7 V based on that an operating electric field of $PbI_2$ is 0.5 V, and then, a sum of the operating voltages of the two is 0.5V/um*50 um+7V=32V. That is, with respect to the same potential, a voltage of –32 V may be applied to the bias electrodes, and a voltage of –7 V may be applied to the connection electrodes, and a voltage of 0 V may be applied to the reading electrodes.

Further optionally, the reading electrodes of the respective detection pixel units are mutually independent, and the bias electrodes of the respective detection pixel units are of an integral structure, thereby implementing the output of light currents from the photoelectric conversion section of the different detection pixel units. Meanwhile, the times of patterning can be reduced, and the impact of the patterning process on the transistors can be reduced.

Without doubt, the bias electrodes of the respective detection pixel units may also be mutually independent to reduce the mutual impact among the detection pixel units.

Optionally, the transistors include thin-film transistors or complementary metal oxide semiconductor transistors.

Specifically, each of the thin-film transistors (TFT) includes a gate, an active layer, a first electrode and a second electrode, where the first electrode and the second electrode may be a drain and a source respectively, and are interchangeable in function depending on the type of the thin-film transistor and an input signal. This is not specifically distinguished here. As an example, referring to the depiction in FIGS. 3 to 5, the thin-film transistor 11 includes an active layer 111, a gate 110, a source 113 and a drain 112. A material for the active layer is not limited, and may include any one of amorphous silicon (aSi), indium gallium zinc oxide (IGZO), and low-temperature poly-silicon (LTPS).

This thin-film transistor may be a bottom-gate type thin-film transistor (with the source and drain both disposed above the gate) as shown in FIGS. 3 to 5; or this thin-film transistor may also be a top-gate type thin-film transistor (with the source and drain both disposed below the gate). This is not limited here. In addition, for the bottom-gate type thin-film transistor, an etching stopper layer (ESL) may be disposed above the active layer, thereby forming a back-channel safeguard (BCS) type TFT; or, the etching stopper layer is not disposed above the active layer, thereby forming a back-channel etching (BCE) type TFT. This is not limited here.

Referring to the depiction in FIG. 6, the complementary metal oxide semiconductor (CMOS) transistor includes a gate 311, a gate oxide layer 315, a drain 312, a source 313, a lightly doped section 310, and a silicon epitaxial layer 318, where the gate 311 includes a polycrystalline silicon layer, the gate oxide layer 315 includes a silicon oxide layer, and both the drain 312 and the source 313 are heavily doped. In order to improve the conductivity, a metal layer is disposed on each of the electrodes, and a material for the metal layers includes tungsten. Specifically, a first metal layer 314 is disposed on the gate 311; a second metal layer 316 is disposed on the drain 312; and a third metal layer 317 is disposed on the source 313. To facilitate the subsequent electric connection, referring to the depiction in FIG. 6, the detection pixel unit further includes a first electrode 34 and a second electrode 35, where the first electrode 34 and the second metal layer 316 are electrically connected, and the second electrode 35 and the third metal layer 317 are electrically connected.

In the complementary metal oxide semiconductor transistor shown in FIG. 6, a core structure includes a Si layer and a $SiO_2$ layer. However, monocrystalline silicon is susceptible to radiation to generate a lot of defects and pitfalls, causing the lightly doped section 310 and the gate oxide layer 315 to create an interface state. Meanwhile, holes are accumulated in the gate oxide layer 315, leading to a change in the electric properties of the transistors, for example, threshold drift, increased electric leakage and the like. If an active pixel sensor (APS) is used as the detection substrate, the characteristic requirements of the transistor will be further improved, thereby further reducing the radiation resistance. In the present application, by introducing the radiation sensitive layers, radiation photons are better blocked from reaching a silicon active layer, thereby improving the quality of the device.

In the detection substrate defined above, PPS or APS may be used, which is not limited here. Specifically, in terms of PPS, one detection pixel unit may output the light current through a one-transistor structure. In terms of APS, one detection pixel unit may output the light current through structures such as a three-transistor structure (3T1C), a four-transistor structure (4T1C), and a five-transistor structure (5T1C) with Vth offset compensation, or a more complicated structure, where in the 3T1C structure, one transistor plays a role of amplification and is used as an amplifier tube (AMP tube).

It should be noted that, referring to the depictions in FIGS. 3 to 6, the detection substrate defined above may further include first passivation layers 16, which are disposed between the scintillator layers 3 and the bias electrodes 24. A material for the first passivation layers 16 may include any one or a combination of silicon nitride and silicon oxide. Without doubt, coverage layers may be further disposed between the first passivation layers and the scintillator layers to further play a protective role; and the coverage layers may include organic resin layers and inorganic silicon nitride layers.

If the transistors of the detection substrate are thin-film transistors, referring to the depictions in FIGS. 3 to 5, the detection substrate may further include first storage electrodes 17 and second storage electrodes 18, both of which are disposed oppositely to form storage capacitors Cst. Here, the first storage electrodes 17 may be disposed on the same layer as the gates 110, and the second storage electrodes 18 may be disposed on the same layer as the sources 113 and the drains 112. Referring to the depictions in FIG. 2, the first storage electrodes (not shown in FIG. 2) or the second storage electrodes 18 are electrically connected to ground wires 6.

Referring to the depictions in FIGS. 3 to 5, the detection substrate may further include a substrate 10, a gate insulating layer 12, a buffer layer 13, a flat layer 14 and a second passivation layer 15, where the reading electrodes 23 are electrically connected to the sources 113 through first via holes (not marked in FIGS. 3 to 5), and the first via holes penetrate through the second passivation layer 15, the flat layer 14 and the buffer layer 13.

If the transistors of the detection substrate are the complementary metal oxide semiconductor transistors, referring to the depiction in FIG. 6, the detection substrate may further include a first interlayer dielectric layer 32 and a second interlayer dielectric layer 33; the reading electrodes 23 are electrically connected to the second electrodes 35 through second via holes (not marked in FIG. 6); and the second electrodes 35 are electrically connected to the third metal layers 317 through third via holes (not marked in FIG. 6), thereby implementing the electric connection between the reading electrodes 23 and the sources 313. Here, the second via holes penetrate through the second interlayer dielectric layers 33, and the third via holes penetrate through the third interlayer dielectric layers 32.

Figure 1:
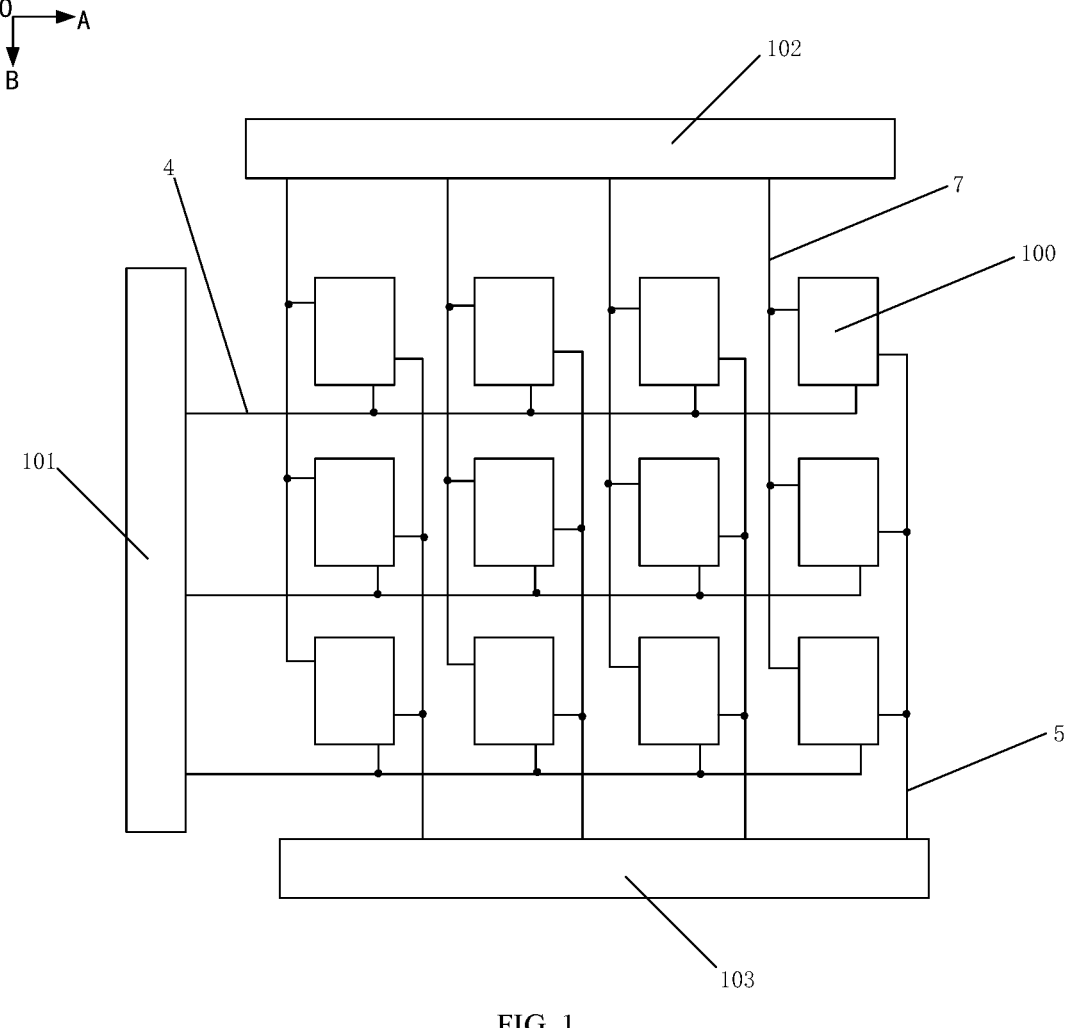
FIG. 1 is a schematic structural diagram of a detection substrate according to an embodiment of the present disclosure.

Optionally, referring to the depiction in FIG. 1, the detection substrate may further include a plurality of gate wires 4 arranged along a first direction (i.e., a direction OB as shown in FIG. 1) and a plurality of data wires 5 arranged along a second direction (i.e., a direction OA as shown in FIG. 1); and the gate wires 4 and the data wires 5 are mutually crossed to form a plurality of defined regions. Here, the detection pixel units 100 are disposed within the defined regions, the first direction is orthogonal to the second direction, and FIG. 1 depicts the first and second directions that are vertically crossed, by way of example. The gate wires are at least electrically connected to the detection pixel units that are arranged in a row along the second direction; and the data wires are at least electrically connected to the detection pixel units that are arranged in a row along the first direction.

The detection pixel units defined above may be shaped as a strip, and the first direction may be the direction OB (i.e., a long-side direction of each of the detection pixel units) as shown in FIG. 1. Then, the second direction may the direction OA (i.e., a short-side direction of each of the detection pixel units) as shown in FIG. 1. Or, the first direction may also be the direction OA (i.e., the short-side direction of each of the detection pixel units) as shown in FIG. 1. Then, the second direction may be the direction OB (i.e., the long-side direction of each of the detection pixel units) as shown in FIG. 1. These are not limited here. FIG. 1 depicts the direction OB as the first direction and the direction OA as the second direction, by way of example.

Figure 2:
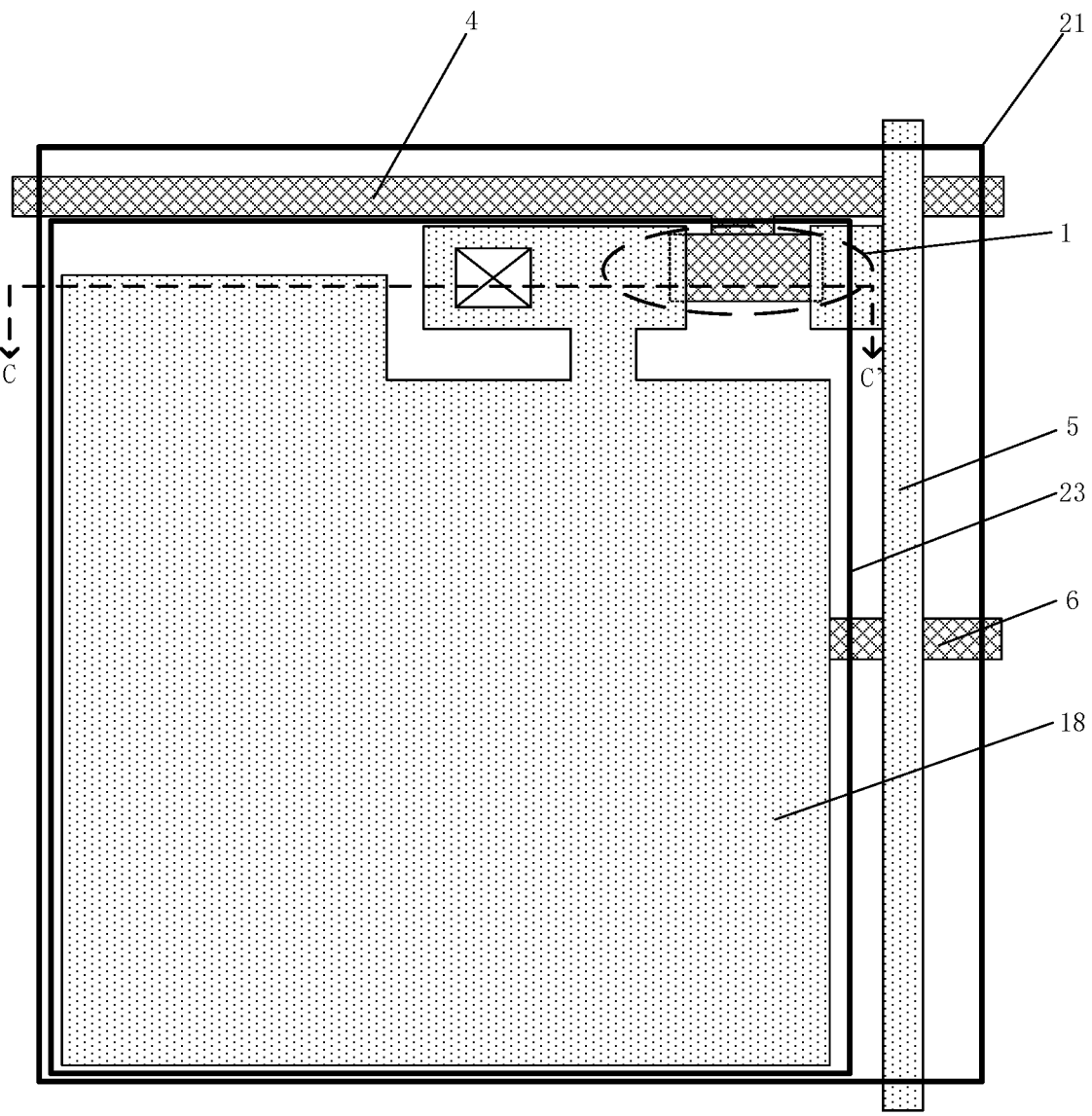
FIG. 2 is a schematic structural diagram of a detection pixel unit according to an embodiment of the present disclosure.

The above description that the gate wires are at least electrically connected to the transistors of the detection pixel units that are arranged in a row along the second direction refers to that: with reference to the depictions in FIG. 1 and FIG. 2, the gate wires 4 are only electrically connected to the transistors 1 of the detection pixel units 100 arranged in a row (i.e., a row in FIG. 1) along the second direction (i.e., the direction OA in FIG. 1); or, the gate wires are electrically connected to the transistors of the detection pixel units that are arranged in a plurality of rows along the second direction. This is not limited here.

The above description that the data wires are at least electrically connected to the transistors of the detection pixel units that are arranged in a row along the second direction refers to that: with reference to the depictions in FIG. 1 and FIG. 2, the data wires 5 are only electrically connected to the transistors 1 of the detection pixel units 100 arranged in a row (i.e., a row in FIG. 1) along the first direction (i.e., the direction OB in FIG. 1); or, the data wires are electrically connected to the transistors of the detection pixel units that are arranged in a plurality of rows along the first direction. This is not limited here.

The aforesaid gate wires may be disposed on the same layer with the gates of the transistors, and the data wires may be disposed on the same layer with the sources and drains of the transistors, in order to reduce the times of patterning and the cost. The arrangement on the same layer here refers to production using a primary patterning process. The primary patterning process refers to a process of forming a desired layer structure through one-time film-forming and photo-etching. The primary patterning process includes processes such as film forming, exposing, developing, etching and peeling.

In the detection substrate defined above, the gate wires may provide control signals to the gates of the transistors to control on or off of the transistors; and the photoelectric conversion sections convert the visible light into electric signals, which are output through the transistors and transmitted to a processing unit through the data wires; and the processing unit processes the electric signals to implement of the display of images.

Further optionally, the detection substrate may further include a plurality of bias voltage wires arranged along the second direction, where the bias voltage wires are at least electrically connected to the bias electrodes of the detection pixel units that are arranged in a row along the first direction.

The above description that the bias voltage wires are at least electrically connected to the bias electrodes of the detection pixel units that are arranged in a row along the first direction refers to that: referring to the depiction in FIG. 1, the bias voltage wires 7 may be only electrically connected to the bias electrodes of the detection pixel units that are arranged in a row (i.e., a column in FIG. 1) along the first direction (i.e., the direction OB in FIG. 1); or, the bias voltage wires are electrically connected to the bias electrodes of the detection pixel units that are arranged in a plurality of rows along the first direction. This is not limited here.

It should be noted that the bias electrodes of the respective detection pixel units in FIG. 1 are mutually independent, and it is necessary to arrange a plurality of bias voltage wires to provide bias signals to different bias electrodes. Without doubt, the bias electrodes of the respective detection pixel units may also be of an integral structure. Then, it is unnecessary to arrange a plurality of bias voltage wires.

The above-mentioned bias voltage wires may be disposed on the same layer with the data wires as well as the sources and drains of the transistors, in order to reduce the times of patterning and the cost.

In this detection substrate, bias signals may be input to the bias electrodes through the bias voltage wires, thereby providing the bias voltage to the photoelectric conversion sections.

Further optionally, referring to the depiction in FIG. 1, the above-mentioned detection substrate may further include a gate drive unit 101, a processing unit 103, and a bias drive unit 102. Here, the gate drive unit 101 is connected with the plurality of gate wires 4 to provide control signals to the gate wires. The processing unit 103 is connected with the plurality of data wires 5 to acquire and process the electric signals output by the data wires. The bias drive units 102 are connected with the plurality of bias volage wires 7 to provide the bias signals to the bias voltage wires. The structures of the gate drive unit, the processing unit and the bias drive unit are not specifically limited here. FIG. 1 only depicts the detection substrate that includes the detection pixel units in three rows and four columns, by way of example.

An embodiment of the present disclosure further provides a flat-panel detector, which includes the detection substrate defined above. The flat-panel detector may be an X-ray flat-panel detector, which is applicable to the fields such as medical treatment, security and industrial detection and has the advantages such as long service life, stable performance, and high response speed. For the structural description related to the flat-panel substrate included in the flat-panel detector, a reference may be made to the embodiments described above, the details of which will not be repeated here anymore.

An embodiment of the present disclosure further provides a method for producing a detection substrate. For the structure of the detection substrate, a reference may be made to the depictions in FIGS. 3 to 6. The method includes the following steps.

In S01, a plurality of detection pixel units arranged in an array are formed on the substrate.

A material for the substrate is not limited, and may include a rigid material such as glass, or may further include a flexible material such as polyimide (PI).

Here, in S01, forming the plurality of detection pixel units arranged in an array on the substrate includes the following steps.

In S101, a plurality of transistors are formed.

The transistors include thin-film transistors or complementary metal oxide semiconductor transistors. A method for forming the plurality of transistors is not specifically limited here, and may be determined depending on the specific structure of the transistors.

In S102, a plurality of photoelectric conversion sections are formed. Here, each of the photoelectric conversion section includes a radiation sensitive layer and a photosensitive unit, which are laminated in arrangement, the radiation sensitive layer is configured to absorb rays and convert the rays into carriers; and the photosensitive unit is configured to at least absorb visible light and convert the visible light into carriers.

The radiation sensitive layers of the plurality of photoelectric conversion sections described above may be of an integral structure, or mutually independent. A method for producing the radiation sensitive layers and the photosensitive units needs to be determined depending on specific structures, which is not limited here.

In S103, a scintillator layer is formed.

A material for the scintillator layer may include any one of cesium iodide (CsI), gadolinium oxide sulfide (GOS), tungstate, alkali metal halide, lutetium fine silicate (LFS), lutetium yttrium silicate (LYSO), thallium-doped sodium iodide (NaI:Tl), cesium iodide (CsI), bismuth germanate ($Bi_4Ge_3O_{12}$, BGO), gadolinium aluminum gallium garnet (GAGG) and the like, where the tungstate may include cadmium tungstate ($CdWO_4$) or lead tungstate (PWO) and the like. The scintillator layer formed from these materials may convert the X-rays into visible light.

The method for producing the detection substrate is specifically explained below by taking the detection substrate shown in FIG. 3 as an example. The method includes the following steps.

In S11, referring to the depiction in FIG. 3, a gate metal layer, a gate insulating layer 12, an active layer 111, a source-drain metal layer, a buffer layer 13, a flat layer 14, and a second passivation layer 15, which are laminated in arrangement, are formed on the substrate 10 in sequence, where the gate metal layer includes a plurality of gates 110 and a first storage electrode 17, and the source-drain metal layer includes a plurality of sources 113 and a plurality of drains 112.

In S12, referring to the depiction in FIG. 3, a plurality of mutually independent reading electrodes 23 are formed on the second passivation layer 15, where the reading electrodes 23 are electrically connected to the sources 113 through first via holes (not marked in FIG. 3), and the first via holes penetrate through the second passivation layer 15, the flat layer 14 and the buffer layer 13.

In S13, referring to the depiction in FIG. 3, a radiation sensitive layer 21 is formed on the reading electrodes 23.

Specifically, the radiation sensitive layer may be produced by methods such as a physical vapor deposition (PVD) method, a solution method, a chemical vapor deposition (CVD) method, and an atomic layer deposition (ALD) method. The PVD method includes: vacuum evaporation, radio-frequency magnetron sputtering and the like. The solution method includes: a spin-coating method, a silk-screen printing method, a scalpel scraping method and the like. The thickness of the radiation sensitive layer is in a range of 1-100 um.

In S14, referring to the depiction in FIG. 3, a photosensitive unit 22 is formed on the radiation sensitive layer 21.

Specifically, each film layer in the photosensitive unit may be deposited by methods such as a plasma enhanced chemical vapor deposition (PECVD) method, a solution method, and a film transfer attachment method. Here, the solution method includes: a spin-coating method, a silk-screen printing method, a deposition method, a scalpel scraping method and the like.

It should be noted that if the photosensitive unit includes a perovskite layer, in S14, forming the photosensitive unit on the radiation sensitive layer includes:

S141, soaking the radiation sensitive layer in a halide-salt alcohol solution at a certain concentration, and taking out the radiation sensitive layer after a period of reaction time.

The halide salt may include a material having an AB molecular structure, where A includes any one or more of MA, FA, a cesium ion, and a rubidium ion; and B includes any one or more of iodine, chlorine, and bromine. The aforesaid halide salt may include an organic halide salt or an inorganic halide salt. As an example, the organic halide salt may include organic iodate. Specifically, the organic iodate may include any one of methylamine iodide (MAI), formamidine iodide (FAI), and methylamine iodine chloride $(MAI_{1-x}Cl_x)$. The alcohol solution above may include isopropanol. If the material of the radiation sensitive layer is $PbI_2$ and the organic iodate is MAI, soaking will promote the reaction between $PbI_2$ and MAI to from a $MAPbI_3$ perovskite polycrystalline film on a $PbI_2$ thin film, and the concentration of an MAI solution and the soaking time are controlled to adjust the thickness of the perovskite polycrystalline layer, allowing the thickness to reach 200-500 nm. With this method, a $PbI_2$-$MAPbI_3$ perovskite heterojunction may be formed, and an interface of the $PbI_2$-$MAPbI_3$ perovskite heterojunction has fewer defects compared with other types of heterojunctions. During operation, some of high-energy rays are absorbed by the scintillator layer to generate visible light, which is then absorbed by the perovskite layer to generate free carriers; meanwhile, the rays that are not absorbed by the scintillator layer transmit through the scintillator layer to reach the perovskite layer, where a small part of the rays are absorbed by the perovskite layer and converted into carriers (since the perovskite layer is very thin), and the rest of rays are mostly absorbed by the $PbI_2$ radiation sensitive layer and converted into carriers, which are delivered to the reading electrodes together with the carriers generated in the perovskite layer under the drive of an electric field and converted int signal charges.

In S15, referring to the depiction in FIG. 3, bias electrodes 24 are formed on the photosensitive units 22.

A material for the bias electrodes may include transparent conductive materials such as ITO, fluorine-doped tin oxide (FTO) transparent conductive glass, aluminum-doped zinc oxide (AZO) transparent conductive glass, and 3,4-polyethylenedioxythiophene:polystyrene sulfonate (PEDOT:PSS).

In S16, referring to the depiction in FIG. 3, a first passivation layer 16 is formed on the bias electrodes 24.

In S17, referring to the depiction in FIG. 3, a scintillator layer 3 is formed on the first passivation layer 16.

A material for the scintillator layer may include any one of cesium iodide (CsI), gadolinium oxide sulfide (GOS), tungstate, alkali metal halide, lutetium fine silicate (LFS), lutetium yttrium silicate (LYSO), thallium-doped sodium iodide (NaI:Tl), cesium iodide (CsI), bismuth germanate $(Bi_4Ge_3O_{12}, BGO)$, gadolinium aluminum gallium garnet (GAGG) and the like, where the tungstate may include cadmium tungstate $(CdWO_4)$ or lead tungstate (PWO) and the like. The scintillator layer formed from these materials may convert the X-rays into visible light.

The embodiments of the present invention provide a detection substrate and a flat-panel detector. The detection substrate includes a plurality of detection pixel units arranged in an array. Each of the detection pixel units includes: a transistor, a photoelectric conversion section, and a scintillator layer, with the photoelectric conversion section disposed between the transistor and the scintillator layer, wherein the photoelectric conversion section includes a radiation sensitive layer and a photosensitive unit, which are laminated in arrangement; the radiation sensitive layer is configured to absorb rays and convert the rays into carriers; and the photosensitive unit is configured to at least absorb visible light and convert the visible light into carriers. In this way, when the rays irradiate the detection substrate, the scintillator layers convert the rays into the visible light, which is then absorbed by the photosensitive units and converted into the carriers. Meanwhile, the rays transmitting through the scintillator layers can be absorbed by the radiation sensitive layers and converted into the carriers, thereby preventing the rays that are not absorbed by the scintillator layers from radiating the transistors. As a result, the radiation resistance is improved and the service life is prolonged without increasing the thickness of the scintillator layers.

The above description only provides the specific embodiments of the present disclosure, but the protection scope of the present disclosure is not limited thereto. Any variations or substitutions easily conceivable by a person skilled in the art within the technical scope of the present disclosure should be included within the protection scope of the present disclosure. Therefore, the protection scope of the present disclosure should be subjected to the protection scope of the claims.

The invention claimed is:

1. A detection substrate, comprising a plurality of detection pixel units arranged in an array;

wherein each of the detection pixel units comprises: a transistor, a photoelectric conversion section, and a scintillator layer, with the photoelectric conversion section disposed between the transistor and the scintillator layer, wherein the photoelectric conversion section comprises a laminate arranged radiation sensitive layer and a photosensitive unit, and a material for the radiation sensitive layers comprises a heavy element with a band gap greater than 2.0 eV; the radiation sensitive layer is configured to absorb X-rays and convert the X-rays into carriers; and the photosensitive unit is configured to at least absorb visible light and convert the visible light into carriers, and wherein the photosensitive units are disposed at a side of the radiation sensitive layers away from the transistors.

2. The detection substrate according to claim 1, wherein the radiation sensitive layers of the respective detection pixel units are of an integral structure and the photosensitive units of the respective detection pixel units are of an integral structure.

3. The detection substrate according to claim 1, wherein the detection substrate further comprises a substrate, on which the detection pixel units are disposed; and in each of the detection pixel units, an orthographic projection of the transistor on the substrate is within an orthographic projection of the radiation sensitive layer on the substrate.

4. The detection substrate according to claim 1, wherein the detection substrate further comprises a substrate, on which the detection pixel units are disposed; and in each of the detection pixel units, an orthographic projection of the photosensitive unit on the substrate is within an orthographic projection of the radiation sensitive layer on the substrate.

5. The detection substrate according to claim 1, wherein the transistors comprise thin-film transistors.

6. The detection substrate according to claim 1, wherein the transistors comprise complementary metal oxide semiconductor transistors.

7. The detection substrate according to claim 1, wherein the photosensitive units comprise photoconductive devices or photoelectric diodes.

8. The detection substrate according to claim 7, wherein the photoelectric conversion sections further comprise connection electrodes, which are disposed between the radiation sensitive layers and the photosensitive units.

9. The detection substrate according to claim 1, wherein the detection pixel units further comprise reading electrodes and bias electrodes; the reading electrodes are disposed at a side of the photoelectric conversion sections close to the transistors; and the bias electrodes are disposed at a side of the photoelectric conversion sections away from the transistors.

10. The detection substrate according to claim 9, wherein the reading electrodes of the respective detection pixel units are mutually independent, and the bias electrodes of the respective detection pixel units are of an integral structure.

11. A flat-panel detector, comprising the detection substrate according to claim 1.

12. The flat-panel detector according to claim 11, wherein the radiation sensitive layers of the respective detection pixel units are of an integral structure and the photosensitive units of the respective detection pixel units are of an integral structure.

13. The flat-panel detector according to claim 11, wherein the detection substrate further comprises a substrate, on which the detection pixel units are disposed; and in each of the detection pixel units, an orthographic projection of the transistor on the substrate is within an orthographic projection of the radiation sensitive layer on the substrate.

14. The flat-panel detector according to claim 11, wherein the detection substrate further comprises a substrate, on which the detection pixel units are disposed; and in each of the detection pixel units, an orthographic projection of the photosensitive unit on the substrate is within an orthographic projection of the radiation sensitive layer on the substrate.

15. The detection substrate according to claim 1, wherein the photosensitive units are configured to absorb X-rays and convert the X-rays into carriers.

16. The detection substrate according to claim 15, wherein the photosensitive units comprise perovskite layers.

17. The detection substrate according to claim 16, wherein a material for the perovskite layers comprises: a perovskite material having an $A_aB_bX_x$ molecular structure, wherein $A_a$ comprises any one or more of: an organic amine group, formamidine, a cesium ion, a rubidium ion, a silver ion, and a cuprous ion; $B_b$ comprises: a lead ion or a bismuth ion; and $X_x$ comprises any one or more of: iodine, chlorine, and bromine.

* * * * *